United States Patent
Lo et al.

(10) Patent No.: US 6,459,709 B1
(45) Date of Patent: Oct. 1, 2002

(54) WAVELENGTH-TUNABLE SEMICONDUCTOR LASER DIODE

(75) Inventors: Yu-Hwa Lo, San Diego; Steven Gregg Hummel, Los Altos, both of CA (US); Chenting Lin, Poughkeepsi, NY (US); Chau-Hong Kuo; Mei-Ling Shek-Stefan, both of Sunnyvale, CA (US); Sergey V. Zaytsev, Cupertino, CA (US)

(73) Assignee: Nova Crystals, Inc., San Jose, CA (US)

( * ) Notice: Subject to any disclaimer, the term of this patent is extended or adjusted under 35 U.S.C. 154(b) by 64 days.

(21) Appl. No.: 09/774,904

(22) Filed: Jan. 31, 2001

(51) Int. Cl.[7] .............................. H01S 5/00; H01S 3/10
(52) U.S. Cl. ........................................... 372/20; 372/45
(58) Field of Search .............................. 372/20, 45, 50, 372/46; 438/32

(56) References Cited

U.S. PATENT DOCUMENTS 5,222,087 A * 6/1993 Thulke et al. ................. 372/20
5,284,791 A * 2/1994 Sakata et al. .................. 438/32

OTHER PUBLICATIONS

T. L. Koch, U. Koren, and B. I. Miller, "High–performance tunable 1.5 $\mu$m InGaAs/InGaAsP multiple quantum well distributed Bragg reflector lasers", Applied Physics Letters, vol. 53, pp. 1036–1038, 1988. (Sep.1988).

T. L. Koch and U. Koren, "Semiconductor photonic integreated circuits", IEEE Journal of Quantum Electronics, vol. 27, pp. 641–653,1991. (Mar. 1991).

M. Oberg, P.–J. Rigole, S. Nilsson, T. Klinga, L. Backbom, K. Streubel, J. Wallin, and T. Kjellberg,"Complete single mode wavelength coverage over 40 nm with a super structure grating DBR laser", IEEE Journal of Lightwave Technology, vol. 13, pp. 1892–1897, 1995. (Oct.1995).

B. Mason, J. Barton, G. A. Fish, L. A. Coldren, and S. P. DenBaars, "Design of sampled grating DBR lasers with integrated semiconductor optical amplifiers", IEEE Photonics Technologies Letters, vol. 12, pp. 762–764, 2000. (Jul. 2000).

* cited by examiner

Primary Examiner—Quyen Leung
(74) Attorney, Agent, or Firm—Fish & Neave

(57) ABSTRACT

A wavelength-tunable distributed feedback (DFB) laser is disclosed where the lasing wavelength can be adjusted by adjusting the bias current of the laser diode. Since the output power of the laser diode also changes with the bias current, a one-to-one correspondence between the lasing wavelength and the output power of the laser can be established. Consequently, the lasing wavelength can be measured directly from the photocurrent of a power monitoring detector facing the back-end of the laser diode. This provides an extremely simple method for wavelength monitoring.

14 Claims, 6 Drawing Sheets

(a)

(b)

(c)

WAVELENGTH-TUNABLE SEMICONDUCTOR LASER DIODE

FIELD OF THE INVENTION

This invention relates to the field of wavelength-tunable semiconductor lasers, and in particular to controllably tuning the lasing wavelength by controlling the optical output power of the laser.

BACKGROUND OF THE INVENTION

Wavelength-tunable lasers have found important applications in optical communication and sensing. Wavelength-tunable lasers play a central role in particular for dense wavelength division multiplexing (DWDM) systems that form the backbone of today's optical communication network. The term "wavelength-tunable laser" is typically applied to a laser diode whose wavelength can be varied in a controlled manner while operating at a fixed heat sink temperature. At the 1550 nm wavelength regime on which most DWDM systems operate, a wavelength shift of 0.1 nm corresponds to a frequency shift of about 12.6 GHz. At a given heat sink temperature, the central wavelength of a conventional distributed feedback (DFB) laser diode may be red-shifted by as much as 0.3 nm or about 40 GHz due to the rise in the temperature of the junction by Ohmic losses. In contrast, at a given heat sink temperature, the wavelength of a tunable laser may vary by several nanometers, corresponding to hundreds or even thousands of GHz, covering several wavelength channels on the International Telecommunication Union (ITU) grid. Depending on the physical mechanisms of wavelength tuning, the lasing wavelength can be tuned in either positive (red) or negative (blue) direction. Controlled wavelength tunability offers many advantages over conventional fixed wavelength DFB lasers for DWDM operation. It enables advanced all-optical communication networks as opposed to today's network where optics is mainly used for transmission and the network intelligence is performed in the electronic domain. All-optical networks can eliminate unnecessary E/O and O/E transitions and electronic speed bottlenecks to potentially achieve very significant performance and cost benefits. In addition, a less extensive inventory of wavelength-tunable lasers than of laser with a fixed wavelength is required. Keeping a large inventory of lasers for each and every wavelength channel can become a major cost issue. For advanced DWDM systems, the channel spacing can be as narrow as 50 GHz (or about 0.4 nm in wavelength), with as many as 200 optical channels occupying a wavelength range of about 80 nm. For the reasons stated above, wavelength-tunable lasers have attracted considerable interest in optoelectronic device research.

There exist different design principles for tunable lasers. Almost all wavelength-tunable laser designs make use of either the change of refractive indices of semiconductor or the change of laser cavity length to achieve wavelength tuning. For the former, common mechanisms for index change include thermal tuning, carrier density tuning (a combination of plasma effect, band-filling effect, and bandgap shrinkage effect), electro-optic tuning (linear or quadratic effect), and electrorefractive tuning (Franz-Keldysh or quantum confined Stark effect). For DFB lasers, the wavelength of the laser light propagating in the waveguide is basically determined by the grating period $\Lambda$. The free-space lasing wavelength $\lambda$ is given by $\lambda = 2 n_{eff} \Lambda$, where $n_{eff}$ is the effective index of refraction of the waveguide and $\Lambda$ is the period for first-order gratings. Accordingly, the change $\Delta\lambda$ in the lasing wavelength $\lambda$ is directly proportional to the change $\Delta n$ of the index of refraction $n_{eff}$.

Referring to FIG. 1, a prior art three-section DBR tunable laser 100 includes an optical gain section 101, a phase control section 102, and a tunable DBR section 103. A first current source 104 pumps the gain section 102 to generate optical gain; a second current source 105 injects carriers to adjust the phase condition of the phase control section 102 so that the resonant frequency matches approximately the peak of the DBR reflectivity; and a third current source 106 controls the reflectivity peak by changing the effective index $n_{eff}$ of the Bragg waveguide section 103. With proper selection of the currents in the DBR region 103 and in the phase control region 102, quasi-continuous wavelength tuning can be achieved. All three sections 101, 102, 103 are optically connected to minimize residue reflections and coupling loss; however, the sections 101, 102, 103 have to be electrically isolated from one another, for example, by layers 107 disposed between the respective sections 101, 102, 103. Three currents, responsible for the gain region, DBR region, and phase control region, have to be supplied; and the lasing wavelength depends on all three currents and is particularly sensitive to the currents in the DBR and phase control region. A continuous wavelength tuning range of about 10 nm can be achieved using this design.

Modifications of the three-section DBR lasers include sampled grated four-section DBR lasers and vernier-tuning sampled grating DBR lasers (not shown). The last device requires four separately controlled current sources to achieve the full tuning range (about 80 nm quasi-continuous tuning).

Alternatively, the lasing wavelength can also be changed by changing the physical length of laser cavity in the surface normal direction. This mechanism has been applied, for example, to vertical-cavity surface-emitting lasers (VCSELs) where typically due to the short cavity length only one or at most very few lasing modes fall within the gain peak. Referring to FIG. 2, a prior art wavelength-tunable VCSEL structure 200 is based on surface micromachining technology. The laser device 200 includes a bottom dielectric DBR mirror 202, a top dielectric DBR mirror 201, an electrostatically controlled membrane 203, and an active region 204. Electrically pumped micro-electro-mechanically tuned VCSEL in the 1550 nm wavelength regime have not yet been demonstrated. However, the laser device 200 can be optically pumped by an incoming pump beam 205 (e.g. a beam from a 980 nm wavelength pump laser) through the bottom mirror 202, with the laser output 206 being emitted from the top mirror 201 disposed on the membrane 203. Wavelength-tuning is obtained by changing the cavity length of the VCSEL through the movement of the membrane 203. With a surface micromachined tunable mirror, a continuous tuning range of 40 nm has been demonstrated with an output power of up to 7 mW coupled to a single mode fiber.

Multiple-section DFB lasers in general have a smaller tuning range than multiple-section DBR lasers, except for the tunable twin-guide (TTG) DFB lasers where relatively wide (about 6 nm) and continuous tuning can be achieved.

In DWDM systems, the wavelength of the channel has to be stabilized within a few gigahertz from the ITU grid, typically less than 10% of the channel spacing. A change of the junction temperature and/or device degradation can cause wavelength drift beyond its acceptable range. Achieving wavelength stability requires monitoring the wavelength in real time using a sophisticated feedback mechanism.

Several commercially available devices and their operation for accurately monitoring the laser emission wavelength are shown in FIGS. 3, 4, and 5. Common to these devices is an optical interference device such as a Fabry-Perot etalon placed between the laser and a photodetector. Critical for the device performance are the mechanical stability and angular precision of the etalon and the collimation of the laser beam impinging on the etalon.

Referring now to FIG. 3, a wavelength-monitoring system 300 includes an optical beam splitter 301, a Fabry-Perot (F-P) etalon 302 connected to a first output of the beam splitter 301, a first photodetector (PD) 303 following the F-P etalon 302, with a second PD 304 connected to the second output of the beam splitter 301 as a reference detector. Once the system is calibrated, the lasing wavelength can be determined from the ratio of the photocurrents of the PDs 303, 304, as illustrated in FIG. 4. In the illustrated example showing exemplary target wavelengths $\lambda_n$, $\lambda_{n+1}$, a rise in the ratio $I_1/I_2$ of the measured photocurren would indicate a decreasing lasing wavelength, while a decrease in the ratio $I_1/I_2$ of the measured photocurrents would indicate an increasing lasing wavelength. Note that there exist multiple wavelengths $\lambda_n$, $\lambda_{n+1}$, that can yield the correct photocurrent ratio, and each wavelength may correspond to an ITU wavelength channel. This design has problems with generating a proper error signal when wavelength hopping occurs.

FIG. 5 shows a more detailed design of a commercial wavelength monitoring system 400, excluding electronic circuitry. A small fraction, typically a few percent, of the received laser light is coupled into the monitoring system by an optical power splitter 401. The beam is collimated in collimator 402 and then split into two approximately equal signals by a beam splitter 403. The photocurrent of PD 404 provides the reference signal proportional to the power of the received laser light. The photocurrent of PD 406 is related to the received power being transmitted through the Fabry-Perot etalon 405. The ratio of these two photocurrents does not depend on the output power of the received laser light.

The manufacturing and operating complexity of the wavelength-tunable lasers and the wavelength monitoring system represent barriers for the production of low cost wavelength-tunable laser modules for low-cost DWDM systems suitable for metropolitan area networks (MAN). It would therefore be desirable to provide a new design for a wavelength-tunable laser where the lasing wavelength can be tuned by a single current source and the lasing wavelength can be measured without requiring interferometric devices.

SUMMARY OF THE INVENTION

According to one aspect of the invention, a wavelength-tunable distributed feedback (DFB) laser structure is disclosed where the lasing wavelength can be adjusted by adjusting a single bias current of the laser diode. Since the output power of the laser diode also increases with the bias current, one can establish a straightforward, one-to-one correspondence between the lasing wavelength and the output power of the laser. Consequently, the lasing wavelength can be measured directly by a power monitoring detector facing, for example, the back-end of the laser diode.

To provide wavelength-tuning, the DFB laser structure includes a second set of quantum wells or a waveguide layer next to the lasing quantum wells as "carrier reservoir". The second set of quantum wells or the waveguide layer has to meet several requirements in order to function effectively as a carrier reservoir without adversely affecting the laser performance. First of all, the carrier reservoir has to have a higher bandgap than the lasing quantum wells to minimize the optical loss. Secondly, a carrier propagation barrier needs to be present between the lasing quantum wells and the reservoir to avoid carriers falling into the lasing quantum wells, which have the lowest bandgap of all materials and the strongest tendency of attracting carriers. Thirdly, the carrier reservoir has to be located in a region where the intensity of optical field is significant so the carrier induced index change can contribute to the change of lasing wavelength of a DFB laser. Finally, the presence of the carrier reservoir should not trigger high-order transverse modes. In other words, the laser should operate in a single longitudinal mode and single spatial mode. A structure meeting the above requirements includes a reverse-biased tunnel junction made of heavily doped $p^+$- and $n^{30}$-layers disposed between two sets of quantum wells to prevent carrier leakage from the reservoir back to the active quantum wells. Because of the carrier tunneling effect, holes can tunnel through the $n^+/p^+$ junction and reach the carrier reservoir to meet the electrons. The carrier concentration in the reservoir is then determined by the spontaneous emission rate and Auger recombination rate. This follows approximately the empirical equation $I=BN^2+CN^3$ where I is the current, N the carrier concentration in the reservoir, and B and C the rates for spontaneous and Auger recombination, respectively. Contributions from defect-related recombination, which is linearly proportional to the carrier concentration, are neglected.

Embodiments of the invention may include one or more of the following features. The laser can be grown on an n-InP substrate and have a p-InP as the upper cladding layer. A thin layer of material having a higher refractive index than InP can be introduced to form gratings for index-coupled DFB lasers. Two unintentionally doped graded-index (GRIN) confinement regions can be located on either side of the quantum well active layers to provide carrier and optical confinement. Between the two GRIN layers, the quantum wells forming the active layer and responsible for lasing are positioned closer to the p-InP cladding layer and additional quantum wells having a higher ground state energy than the active layer and forming the carrier reservoir are located near the n-InP lower cladding layer.

According to another aspect of the invention, the laser output may be coupled to a semiconductor laser amplifier (SLA) to allow an independent adjustment of the lasing wavelength and the optical output power of the device. Optionally, the laser output may be coupled to an optical modulator, such as an electro-absorption modulator, to externally modulate the laser light to reduce chirping. The modulator may be used with or without the SLA. Detectors may be provided to measure an output power of the laser beam and/or the amplified laser beam and/or the modulated laser beam.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

One aspect of the present invention relates to a semiconductor laser with a novel epitaxial layer structure, wherein the laser can be wavelength-tuned by varying the pump power of the laser using a single current source. Another aspect of the present invention relates to a simplified arrangement for measuring the lasing wavelength without employing interferometric devices.

A major challenge of using a single current source to tune the wavelength is carrier pinning effect above threshold. In semiconductor diode lasers having a conventional active layer consisting of a single waveguide or single/multiple quantum wells, the carrier concentration in the waveguide/ quantum wells increases with the injected current below the lasing threshold, with the carrier concentration becoming essentially pinned at a fixed value once the threshold current is reached. Beyond threshold, the laser output power increases with the current linearly, but the carrier concentration, hence the effective index of refraction, remains more or less constant. Because of the carrier pinning effect, the contribution of carrier-induced index change becomes negligible. A solution provides by the present invention incorporates a second set of quantum wells or a second waveguide layer next to the lasing quantum wells as "carrier reservoir". The second set of quantum wells or a second waveguide layer is electrically isolated from the active quantum wells by a tunnel junction made of heavily doped $p^+$- and $n^+$-layers. When one applies a forward current to the laser structure, the laser active junction is forward biased as regular laser p/n junction and electron-hole recombination occurs in the quantum wells. However, the $n^+/p^+$ tunnel junction that separates two groups of quantum wells is reverse-biased.

Figure 1:
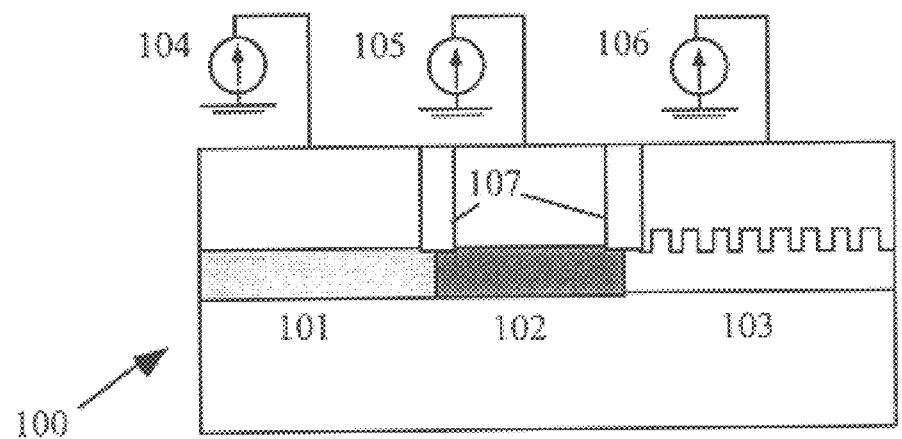
FIG. 1 is a schematic diagram of a conventional 3-section DBR tunable laser.
Figure 2:
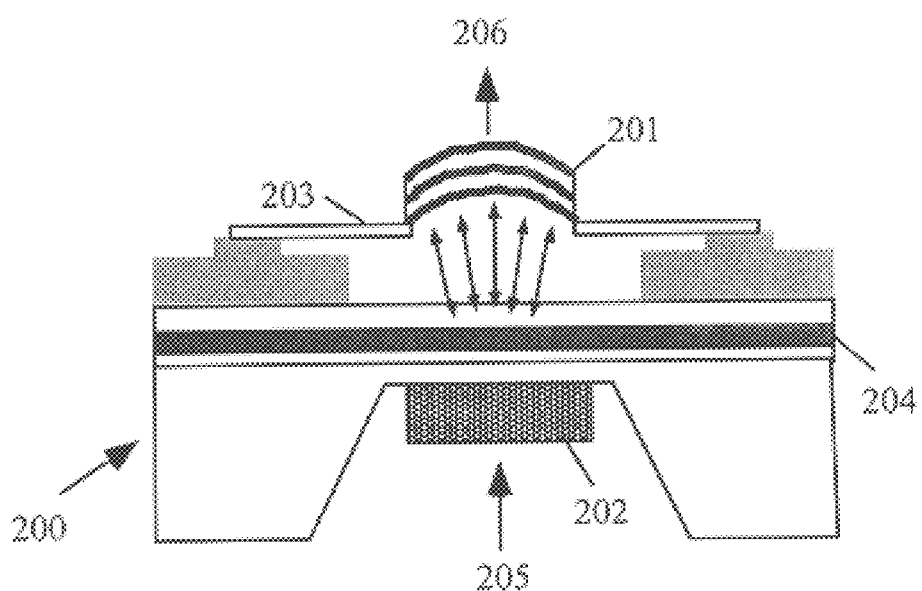
FIG. 2 is a schematic diagram of an optically pumped MEMS VCSEL tunable laser.
Figure 3:
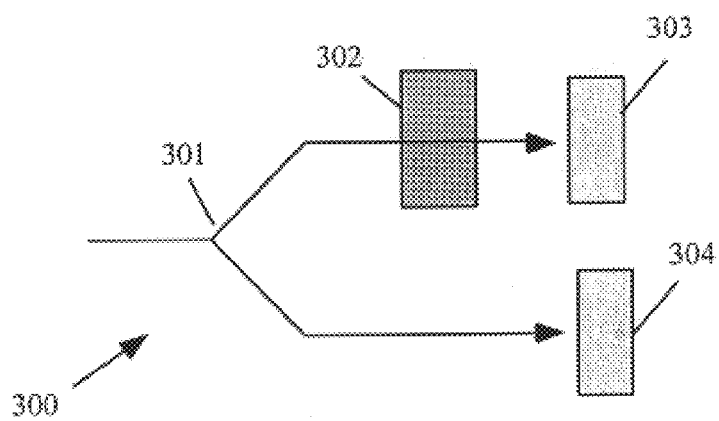
FIG. 3 is a simplified block diagram of a conventional wavelength monitor.
Figure 4:
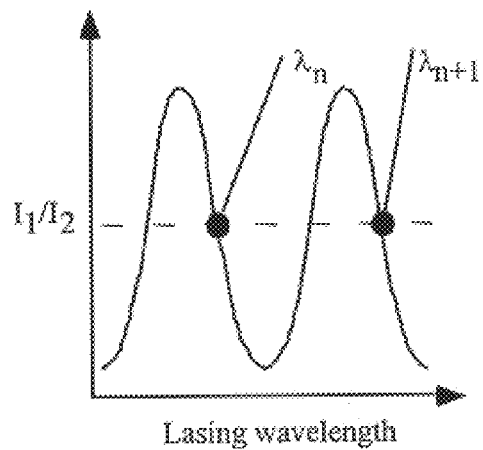
FIG. 4 shows schematically the operation of the wavelength monitor of FIG. 3.
Figure 5:
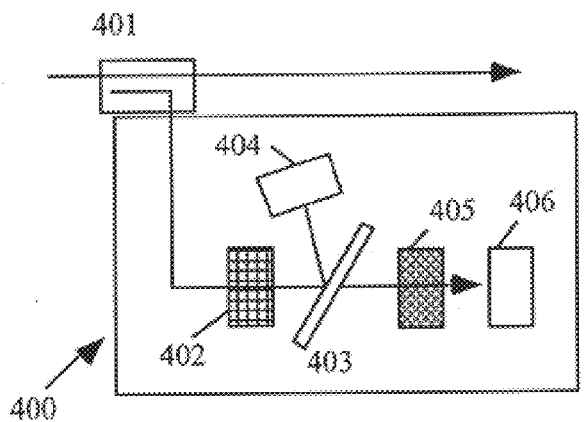
FIG. 5 shows the wavelength monitor of FIG. 3 in greater detail.
Figure 6:
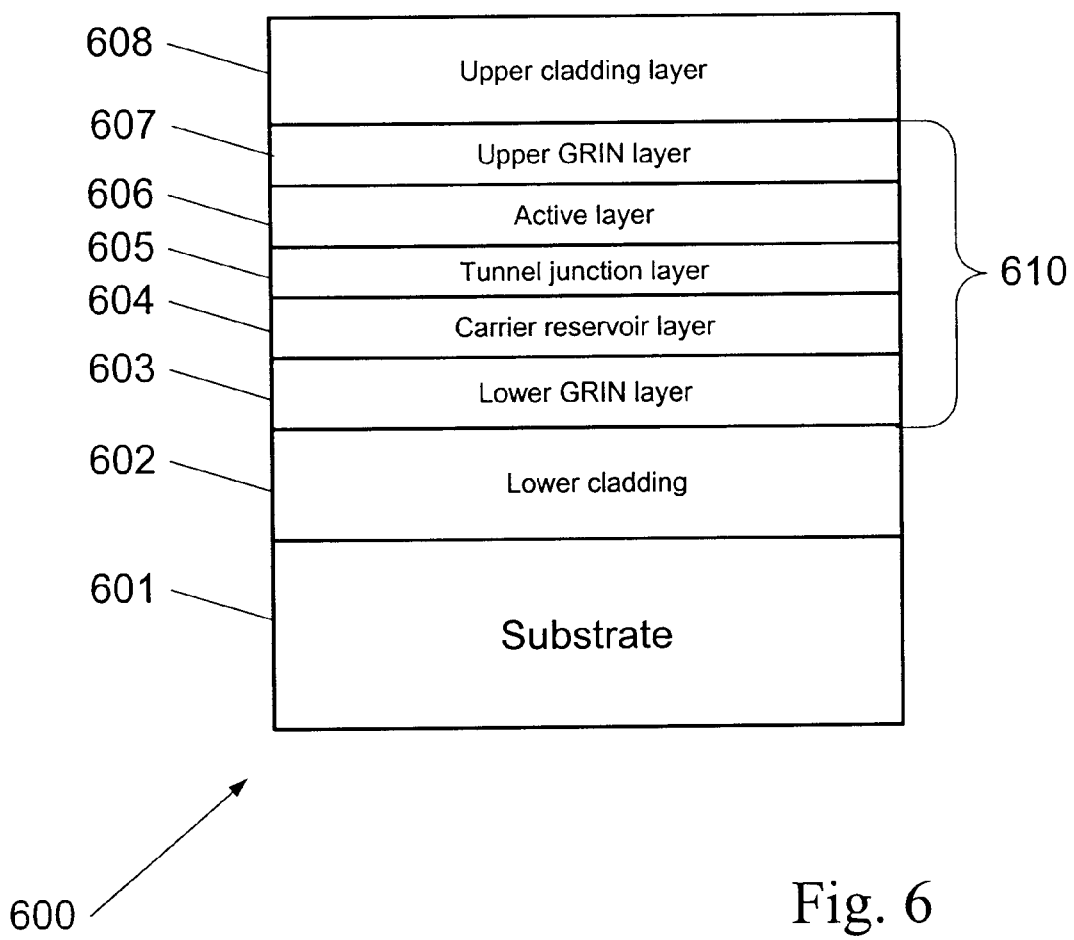
FIG. 6 is a schematic diagram of a simplified epitaxial layer structure for a wavelength-tunable distributed feedback (DFB) laser of the invention.

FIG. 6 shows an exemplary epitaxial layer structure 600 according to the invention that provides the tunability. In all other aspects, the device is similar to a conventional distributed feedback (DFB) laser, with a grating similar to that shown for the DBR section 103 of FIG. 1. The layer structure 600 is fabricated on a semiconductor substrate 601 and includes, in that order and starting from the substrate 600, a lower cladding layer 602, a lower graded-index (GRIN) layer 603, a carrier reservoir layer 604, a tunnel junction 605, an active layer 606, an upper GRIN layer 607, and an upper cladding layer 608. Other typical laser device layers, such as buffer layers and/or contact layers, are not shown. Also not shown is the grating layer of the DFB laser structure 600 which can be placed either below or above the active layer. The cladding layers 602, 608 and the GRIN layers 603, 607 have a higher bandgap and a lower refractive index than the active layer 606 to assist in the confinement of carriers and optical field in the active region. The active layer 606 produces optical gain and roughly determines the lasing wavelength within the gain profile. The gain profile is typically about 100 nanometers wide. The active layer may be a "bulk" semiconductor layer or one or more quantum wells.

Unlike a conventional epitaxial semiconductor laser device structure which typically consists of layers 602, 603, 606, 607, 608 grown on substrate 601, the invented structure includes in addition the carrier reservoir layer 604 and the tunnel junction layer 605. The function of the latter two additional layers, the carrier reservoir layer 604 and the tunnel junction layer 605, will now be described.

Figure 7:
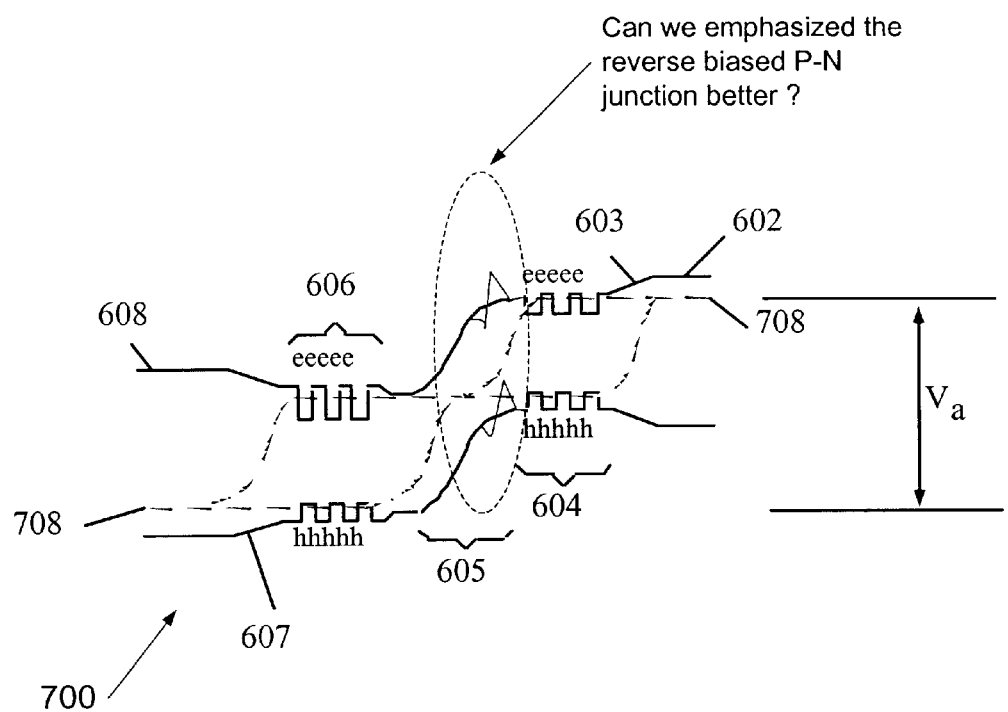
FIG. 7 shows an energy band diagram of the laser structure of FIG. 6 under an applied forward bias $V_a$.

Referring now to FIG. 7, from right to left is shown a schematic energy band diagram 700 of the laser structure 600, with the reference numerals referring to the respective layers of laser structure 600. The quasi Fermi level 708 shows that the voltage drop occurs at the laser active p-n junction and the carrier reservoir p-n junction. These two junctions are stacked together and separately by a tunnel junction having a negligible voltage drop, as shown in the energy and diagram. The band diagram 700 can apply to any material system known in the art for fabricating semiconductor quantum-well heterojunction laser structures, such as GaAlAs, InP/GaInAs, GaAlInN and the like. In an exemplary structure for a 1550 nm wavelength laser emission, the following composition and doping could be employed: substrate 601: n-InP; lower cladding layer 602: n-InP; lower graded-index (GRIN) layer 603: n-InGaAlAs; carrier reservoir layer 604: nominally undoped InGaAlAs MQW; tunnel junction 605: $n^+/p^+$ InGaAsP or InGaAlAs having a bandgap wavelength of around 1.4 μm; active layer 606: nominally undoped InGaAlAs MQW; upper GRIN layer 607: p-InGaAlAs; and upper cladding layer 608: p-InP. The InGaAsP and InGaAlAs layers are preferably lattice-matched to InP and are understood to have the composition $In_x(Ga_yAl_{1-y})_{1-x}As$, wherein x determines the lattice-match to the InP substrate and the bandgap can be varied for a constant x by varying y. The effective bandgap of the carrier reservoir 604 is selected to be lower than the bandgap of the surrounding layers 603, 605 to form a "valley" to collect carriers (both electrons and holes). However, the effective bandgap of the carrier reservoir 604 is selected to be a slightly higher than the active region to minimize the optical loss in the laser waveguide 610 which is formed by all the layers 603, 604, 605, 606 and 607. The refractive index of the reservoir layer 604 decreases with the number of carriers in layer 604. This causes a reduction $\Delta n_{eff}$ of the effective index $n_{eff}$ of the laser waveguide 610, leading to a decrease $\Delta \lambda$ in the lasing wavelength λ according to the relation $\Delta \lambda = 2\Delta^* \Delta n_{eff}$. Λ is the grating period of the DFB laser, as described above.

However, for the carrier reservoir 604 to function properly, several conditions have to be fulfilled: (1) the carrier reservoir 604 has to retain a portion of the injected carriers, with the portion being related to, for example, proportional to the total number of injected carriers, i.e., the operating current of the laser; (2) the carrier reservoir 604 should be electrically isolated from the active region 606, while optically being a part of the active region 606; and (3)

the carrier reservoir itself should not contribute to lasing, i.e., the gain peak of the reservoir 604 should be outside the operating wavelength of the DFB laser.

When a laser is operated above threshold, the quasi-Fermi level and the carrier concentration in the active region 606 are approximately "fixed". An increase in the injection current converts more electron-hole pairs into photons to generate higher optical power without significantly changing the carrier concentration in the active region 606 or lasing wavelength, except for band filling. If the carrier reservoir 604 is not electrically separated from the active region 606, the carrier concentration in the reservoir 604 will also be roughly fixed, independent of the injection current. The carrier concentrations in both regions 604, 606 can be decoupled by introducing a tunnel junction between the active region 606 and the carrier reservoir 604. In this case, above threshold, the carrier concentration in the reservoir 604 increases with increasing current, while the carrier concentration in the active region 606 remains fixed. Since, as mentioned above, $n_{eff}$ decreases with increasing carrier concentration in the reservoir 604, the lasing wavelength of a DFB laser can be tuned by adjusting the carrier density in the reservoir 604, i.e., the laser drive current. In other words, the lasing wavelength controllably decreases with increasing injection current and hence also with increasing optical power. Because a unique relation exists between the output power and the lasing wavelength, the wavelength of the laser can be measured and adjusted simply by measuring the output power of the laser without requiring sophisticated wavelength monitoring devices.

The epitaxial layer structure is fabricated in a conventional manner, for example, by MOCVD or MBE, so that the gain profile covers the intended operation wavelength range and the layer and device structure favor operation in the fundamental transverse mode.

The coupling coefficient κ of the DFB grating on one of the layers close to the active region is selected so that the coupling is in the range of 30 to 300 $cm^{-1}$ and the product of κL is between 1 and 10, where L is the laser cavity length.

For an operating wavelength of 1.5 μm, the bandgap of the carrier reservoir should be approximately 0.1 eV greater than the bandgap of the active region. For this difference in bandgap, the change in the refractive index with carrier concentration in the reservoir is approximately dn/dN=−1.8×10$^{20}$ cm$^{-3}$, and approximately dn/dN=−2.4×10$^{20}$ cm$^{-3}$ when the difference in bandgap is reduced to 0.05 eV. The approximate wavelength tuning range is given by Δμ=η (dn/dN*ΔN)*λ/n, wherein η is the confinement factor for the reservoir layer, ΔN is the increase in the carrier concentration variation with current above the lasing threshold, and n is the effective index. Using typical parameters of η=0.2, dn/dN=−2.4×10$^{20}$ cm$^{-3}$, ΔN=3×10$^{18}$ cm-3, n=3.3, and λ=1550 nm, a continuous wavelength tuning range Δλ of about 7 nm is obtained. This is similar to the 6nm tuning range of twin-guide (TTG) DFB lasers also using carrier induced index change for wavelength tuning.

The expected wavelength tuning range is eventually limited by junction heating, carrier-induced optical losses, and carrier recombination in the reservoir.

Figure 8:
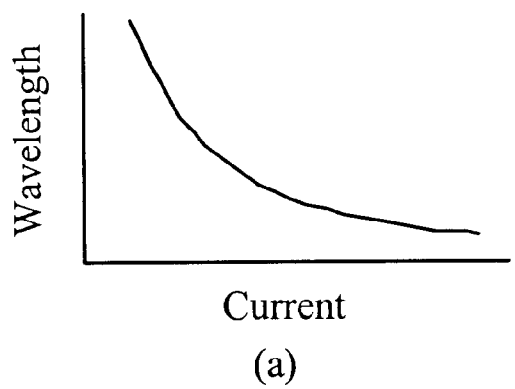
FIGS. 8a–c shows the laser characteristics for (a) wavelength versus drive current, (b) optical output power versus drive current, and (c) wavelength versus optical output power.
Figure 8:
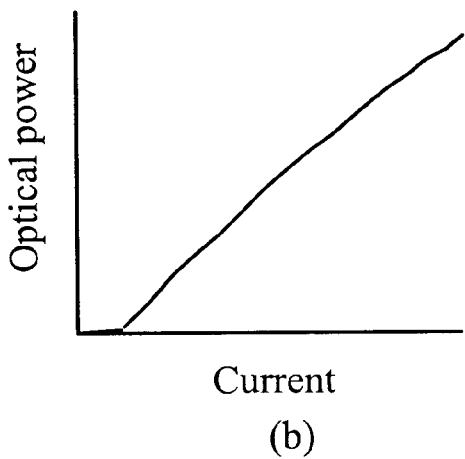
Figure 8:
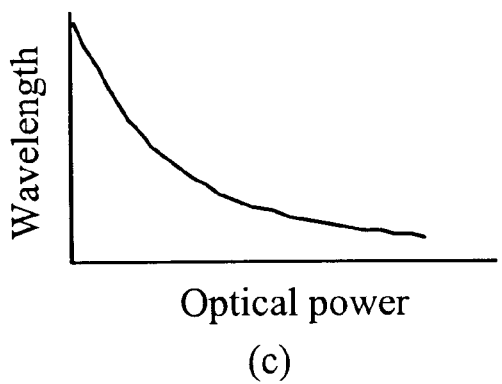

FIGS. 8a–c show schematically characteristic curves for wavelength versus current (FIG. 8a), optical power versus current (FIG. 8b), and wavelength versus optical power (FIG. 8c) of the tunable DFB laser of the invention. As evident from FIG. 8c, the wavelength can be tuned by adjusting a single current and monitoring by the laser output power without requiring a Fabry-Perot etalon. For DWDM systems of 50 GHz channel spacing, the wavelength control has to be within ±5 GHz (or ±0.4 Å). If the tuning range of a laser diode is 7 nm, one needs to measure the photocurrent to an accuracy of 0.4/70, which requires an 8 bit resolution A/D converter. This requirement can be easily met with low cost commercial A/D converters having 14-bit resolution. The shot noise of the detector is not expected to be an issue either since the wavelength monitoring detector operates at a very low bandwidth.

Figure 9:
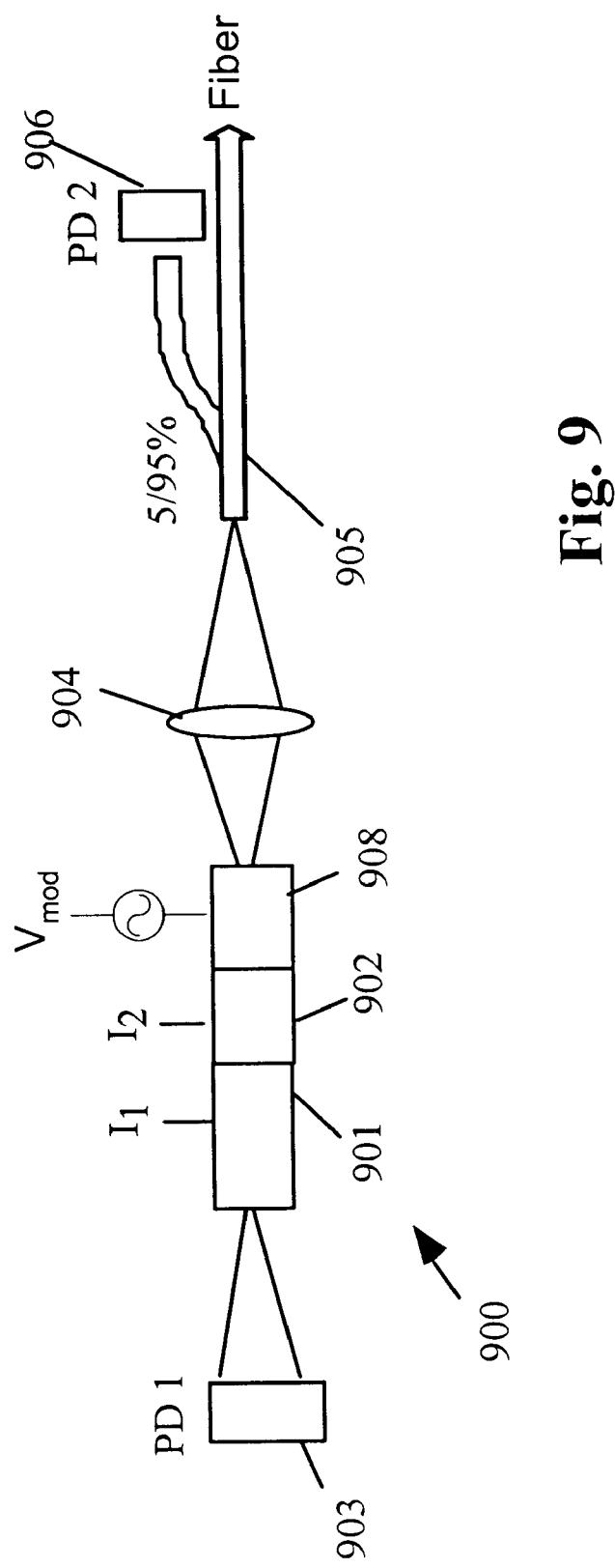
FIG. 9 shows a wavelength-tunable laser integrated with an optical amplifier for simplified wavelength monitoring and an optional external optical modulator.

According to another embodiment depicted in FIG. 9, the wavelength of a laser system 900 can be adjusted independent of the output power produced by the system 900. The system 900 includes the wavelength-tunable DFB laser 901 of the type described above in combination with an optical amplifier 902. The laser/amplifier combination 900 may be, for example, a tunable laser monolithically integrated with semiconductor optical amplifier or a hybrid integration of the tunable laser with a fiber amplifier. The laser system 900 further includes a back-end detector 903 for monitoring the laser power, which in this case corresponds to the lasing wavelength; focusing optics 904; a power splitter 905 receiving light from the front end of the optical amplifier 902, with a predetermined fraction of the received light split off and entering an output power detector 906 to monitor the power coupled, for example, into an optical fiber 907. Also shown in FIG. 9 is an optional external modulator 908. Again; the wavelength of the laser can be controlled by controlling only the laser drive current with a single current source, while both the wavelength and the final optical power into the fiber are monitored only by photodetectors without interferometric components that are sensitive to misalignment.

To modulate the light, the laser may be modulated either directly by controlling the drive current or externally using an external modulator. The preferred method of modulation depends on applications. For directly detected (non-coherent) DWDM systems, low chirping (wavelength/frequency variation with power) is important to minimize dispersion penalty, so external modulation is desirable. The external modulator 908 can be an electro-absorption (EA) modulator or an interference-type electro-optic (EO) modulator. The position of the modulator 908 and the optical amplifier 902 can be interchanged although the arrangement shown in FIG. 9 is more convenient from device fabrication and signal isolation point of view. On the other hand, if coherent detection systems such as homodyne and heterodyne systems are used, direct modulation of tunable lasers might be preferred. The laser of the invention has an optical FM efficiency that is approximately 100 times that of conventional DFB lasers (about 30 GHz/mA compared to about 300 MHz/mA for conventional DFB lasers). This means that the modulation current can be as much as 30 times smaller in an optical frequency division multiplexing (OFDM) or optical frequency-shift-keying (FSK) system, making the laser of the invention more efficient than the conventional DFB laser.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

We claim:

1. An electrically pumped semiconductor laser device having a waveguide region, the waveguide region comprising an active layer and a carrier reservoir, wherein electric carriers are injected into the active layer by tunneling through a reversed biased p-n junction disposed between the active layer and the carrier reservoir to produce lasing radiation by recombination in the active layer, and wherein a lasing wavelength of the laser device is determined by a carrier concentration in the carrier reservoir, with said carrier concentration depending on the pump current.

2. The laser device of claim 1, wherein the laser device is a distributed feedback (DFB) laser.

3. The laser device of claim 1, wherein at least one of the active layer and the carrier reservoir comprise a quantum well.

4. The laser device of claim 1, wherein a bandgap of the active layer is smaller than a bandgap of the carrier reservoir.

5. The laser device of claim 1, wherein the waveguide comprises InGaAlAs.

6. An electrically pumped wavelength-tunable semiconductor distributed feedback (DFB) laser comprising:
   a first cladding layer of a first conductivity type,
   a second cladding layer of a second conductivity type, and
   an optical waveguide region disposed between the first cladding layer and the second cladding layer, the optical waveguide region comprising an active layer and a carrier reservoir, wherein the active layer is electrically isolated from the carrier reservoir by a reverse-biased p-n junction disposed between the active layer and the carrier reservoir so as to retain a concentration of electric carriers in the carrier reservoir substantially independent of a laser drive current, with the concentration of the electric carriers in the carrier reservoir determining a refractive index of the optical waveguide region, and
   a grating disposed proximate to the waveguide region and determining in conjunction with the refractive index a lasing wavelength,
   wherein the wavelength of the DFB laser can be controllably tuned by adjusting a laser drive current.

7. The laser of claim 6, wherein the first and second cladding layers comprise InP and the waveguide region comprises at least one of AlGaInAs and InGaAsP.

8. A wavelength-tunable laser system comprising:
   an electrically pumped semiconductor distributed feedback (DFB) laser producing a laser beam and including
   a first cladding layer of a first conductivity type,
   a second cladding layer of a second conductivity type,
   an optical waveguide region disposed between the first cladding layer and the second cladding layer, the optical waveguide region comprising an active layer and a carrier reservoir, wherein the active layer is electrically isolated from the carrier reservoir by a reverse-biased p-n junction disposed between the active layer and the carrier reservoir so as to retain a concentration of electric carriers in the carrier reservoir substantially independent of a laser drive current, with the concentration of the electric carriers in the carrier reservoir determining a refractive index of the optical waveguide region, and
   a grating disposed proximate to the waveguide region and determining in conjunction with the refractive index a lasing wavelength,
   an optical amplifier receiving the laser beam and producing an amplified laser beam,
   a first detector that measures an output power of the laser beam, wherein the lasing wavelength is determined by the measured output power, and
   a second detector that measures an output power of the amplified laser beam, with the output power of the amplified laser beam capable of being adjusted independent of the lasing wavelength.

9. The laser system of claim 8, further comprising a modulator which modulates the amplified laser beam in response to a modulation signal applied to the modulator.

10. A method of producing wavelength-tunable laser radiation from a DFB laser structure using a single pump current, comprising:
    providing in a waveguide region of the DFB laser structure a carrier reservoir that is electrically isolated from an active layer by a reverse-biased p-n junction,
    adjusting the pump current to change an index of refraction of the waveguide region through a change in a carrier concentration in the carrier reservoir and an output power of the DFB laser structure, and
    determining the wavelength of the laser radiation from the output power.

11. The method of claim 10, wherein the wavelength of the laser radiation is approximately 1.5 $\mu$m.

12. The method of claim 10, wherein the DFB laser structure is made of a material selected from the group consisting of InP, InGaAsP, and GaAlInAs.

13. The method of claim 10, further including amplifying the laser radiation so that an optical power of the amplified laser radiation can be selected independent of the wavelength.

14. The method of claim 10, further including modulating the laser radiation so that an optical power of the modulated laser radiation can be selected independent of the wavelength.

* * * * *